(12) United States Patent
Schwenk et al.

(10) Patent No.: US 6,309,296 B1
(45) Date of Patent: Oct. 30, 2001

(54) VENTILATED HOUSING

(75) Inventors: Hans-Martin Schwenk, Wiesenweg; Heinz Kempf, Raiffeisenstrasse; Peter Takats, Pforzheimerstrasse, all of (DE)

(73) Assignee: Schroff GmbH, Straubenhardt (DE)

( * ) Notice: Subject to any disclaimer, the term of this patent is extended or adjusted under 35 U.S.C. 154(b) by 0 days.

(21) Appl. No.: 09/266,677

(22) Filed: Mar. 11, 1999

(30) Foreign Application Priority Data

Mar. 13, 1998 (DE) ............................................. 198 10 945

(51) Int. Cl.[7] ....................................................... H05K 5/00
(52) U.S. Cl. ............................................ 454/184; 361/695
(58) Field of Search .......................... 454/184; 55/385.4; 174/16.1; 361/690, 695

(56) References Cited

U.S. PATENT DOCUMENTS

| | | |
|---|---|---|
| 4,618,071 | 10/1986 | Vincent . |
| 5,573,562 | * 11/1996 | Schauwecker et al. ............ 55/385.4 |
| 5,575,832 | * 11/1996 | Boyd ......................................... 95/91 |
| 5,646,823 | 7/1997 | Amori . |
| 5,688,169 | * 11/1997 | Duong et al. ......................... 454/184 |
| 6,052,282 | * 4/2000 | Sugiyama et al. .................... 361/690 |
| 6,088,225 | * 7/2000 | Parry et al. ........................... 361/704 |

FOREIGN PATENT DOCUMENTS

| | | |
|---|---|---|
| 348794 | 8/1920 | (DE) . |
| 295 19 260 U1 | 3/1996 | (DE) . |
| 0 810 704 A2 | 12/1997 | (EP) . |
| 196 23 677 A1 | 12/1997 | (DE) . |

* cited by examiner

Primary Examiner—Harold Joyce
Assistant Examiner—Derek S. Boles
(74) Attorney, Agent, or Firm—Merchant & Gould P.C.

(57) ABSTRACT

A double-walled housing 1 for the accommodation of electrical and electronic components possesses on its inner wall 2 a ventilation opening 11. In the gap 4 between inner wall 2 and external wall 3 sits an air filter 12 with a cylindrical filter cartridge 13. This air filter is drawn up on a supporting lattice 14, which is fastened to a removable assembly ring 15. A closeable service opening 20 with a cover 21 is in the external wall 3 and aligns with the ventilation opening 11.

18 Claims, 1 Drawing Sheet

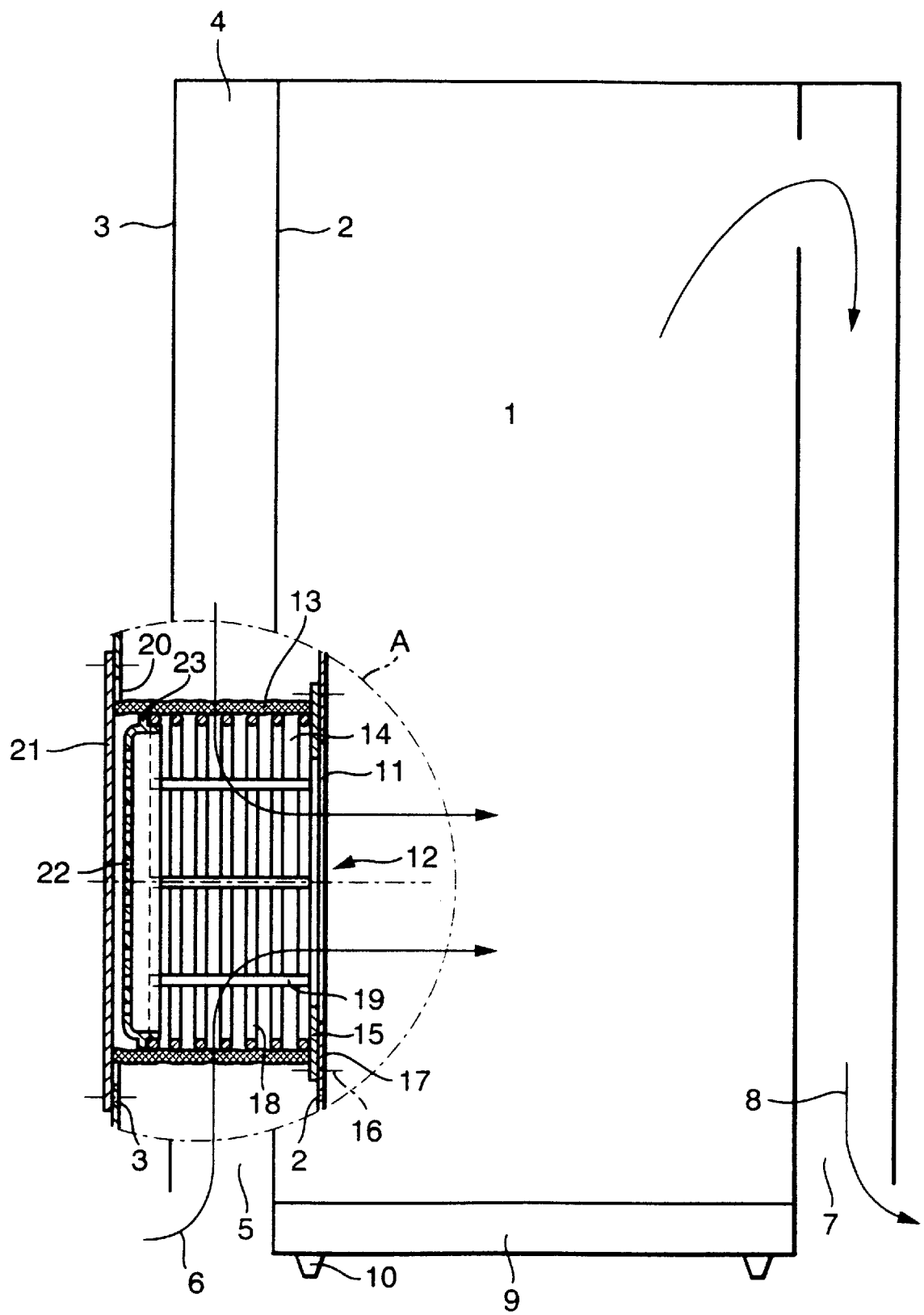

VENTILATED HOUSING

BACKGROUND OF THE INVENTION

The invention concerns a ventilated housing for the accommodation of electrical and electronics components comprising of an inner wall, external wall, intake for fresh air which leads into the gap between the inner wall and the external wall, outlet for the exhaust from the gap, and a ventilation opening with an air filter for fresh air.

Housings and equipment cabinets for electrical and electronic devices containing double walls are customary. Such cabinets are preferably intended for external application, given variable external conditions, they are used to ensure a permanent trouble-free operation of the inserted electrical and electronic systems. The removal of the components dissipated heat takes place in a simple way via the application of the chimney flue-effect due to the constructive layout of the cabinets (DE 348,794, DE 295 19 260, EP 0810704).

In order to prevent the penetration of air pollution such as dust, foreign bodies, insects etc. into the inside of the housing, which can lead to operational disturbances, air filters are absolutely necessary (DE 196 23 677).

The air filters however may not obstruct the thermionics in the gap between the outside and the internal covering of the housing, which is designated for air circulation. This demand can be only fulfilled if the filter surfaces are laid out with enough space in order to avoid air congestion.

Also ventilated housings or cabinets are subjected to standards regarding their external dimensions as well as their internal dimensions. These dimensions must be selected such that they permit problem-free installation of standard components, for instance those in the shape of modules or module carriers. The space available to install larger filter surfaces in the housing is therefore mostly very limited. An enlargement of the intermediate space quickly reaches its boundaries.

SUMMARY

The task of the invention exists in the conception of an air filter, which despite large filter surface needs only very little room for its installation in the housing.

For the solution of the task one proceeds from a double-walled, ventilated housing of the type mentioned above. The task is solved by the following technical features: The ventilation opening is in the inner wall, the air filter sits before the ventilation opening in the gap as the air filter serves as a filter cartridge, the filter cartridge surrounds the ventilation opening and is clamped between the inner wall and external wall.

In this suggested air filter, the selected diameter of the cylindrical filter cartridge crucially determines the size of the filter surface, which corresponds to the lateral area of the cartridge. This diameter may exceed the width of the ventilation opening, resulting in a large effective surface for the air filter.

It is favorable if the filter cartridge possesses the form of a cylindrical socket, which clamps between the inner wall and the external wall with its edges sealing on them.

A further development of the invention is a cylindrical supporting lattice, onto which the filter cartridge is pushed. This supporting lattice also stabilizes the position of the filter cartridge when the formation of a certain negative pressure occurs before the ventilation opening.

Appropriately the supporting lattice is located on an assembly ring, which is fastened to the edge of the ventilation opening and is removable.

So that the filter cartridge can be easily changed, a service opening is formed, whose inside diameter is larger than the outside diameter of the assembly ring. This service opening can be closed by a removable cover and corresponds to the ventilation opening at the external wall.

DETAILED DESCRIPTION OF THE PREFERRED EMBODIMENT

The supporting lattice appropriately has a removable, circular grille. This measure ensures that when the filter cartridge is exchanged, the interior of the housing cannot be accessed unintentionally through the ventilation opening.

In the drawing the design of the invention is simplified, schematically shown, and the details are described as follows. The filter arrangement is thereby represented in an increased scale within the field indicated by dashed lines A.

The ventilated housing 1 is intended for use in the installation of electrical and electronic components and is predominantly free standing.

The housing 1 is depicted with double-walls and possesses an inner wall 2 and an external wall 3, which are constructed from corrosion proof steel sheet. Between inner wall 2 and external wall 3 a gap 4 is formed, which is intended for ventilation measures.

An intake 5 for fresh air 6 coming from the outside leads into the gap 4 between the inner wall 2 and external wall 3, an outlet 7 for the warmed exhaust 8 lies opposite the intake 5, both are situated in the base 9 area of the housing 1 which rests on the feet 10. In addition, the movement of air in the housing 1 is caused by the flue-chimney effect of the intermediate space 4. This can also take place by means of forced ventilation.

A ventilation opening 11, which leads into the interior of the housing 1, is above the base 9 in the inner wall 2. An air filter 12 sits in the gap 4 in front of this ventilation opening 11.

The air filter 12 comprises a filter cartridge 13, which possesses the form of a short, cylindrical and thin-walled socket. The filter cartridge 13 comprises an air-permeable, felt-like textile material or a filter paper.

The filter cartridge 13 is located in the gap 4 so that it centrically surrounds the ventilation opening 11 and gets squeezed between the inner wall 2 and external wall 3.

The filter cartridge 13 rests on and is pushed onto a cylindrical supporting lattice 14. The removable supporting lattice 14 is fastened to a flat assembly ring 15, which is fastened using threaded joints 16 at the edge 17 of the air opening 11.

The supporting lattice 14 comprises several rings 18 lying next to one another. These are of equal diameter and made from a circular cross section of a surface protected material, for example out of stainless steel. The rings 18 are held at a distance from each other by rods 19 that are fastened to the assembly ring 15.

At the external wall 3 of the housing 1 a service opening is intended that can be closed by a removable cover 21. This service opening enables a problem-free removal of the air filter 12 and the exchange of the filter cartridge 13. The service opening 20 and the assembly ring 15 are circular, whereby the clearance of the service opening 20 is larger than the outside diameter of the assembly ring 15.

The supporting lattice 14 supports a circular grille 22, which, with the high-standing edge of the ring 23, is placed onto the supporting lattice 14. This grille 22 lies close beneath the cover 21 of the service opening 20 and serves as a preventive measure against unintentional access into the interior of the housing when changing the filter cartridge 13.

LIST OF REFERENCE SYMBOLS

A dashed lines
1 housing
2 inner wall
3 external wall
4 gap
5 intake
6 fresh air
7 outlet
8 exhaust
9 base
10 feet
11 ventilation opening
12 air filters
13 filter cartridge
14 supporting lattice
15 assembly ring
16 threaded joint
17 edge
18 ring
19 rod
20 service opening
21 cover
22 grille
23 edge of ring

What is claimed is:

1. A ventilated housing for the accommodation of electrical and electronics components, comprising:
   an inner wall and an external wall, having a gap intermediate the inner wall and external wall,
   an intake for fresh air, which leads into the gap between the inner wall and external wall;
   an outlet for exhaust from the gap,
   a ventilation opening located in the inner wall and a service opening located in the external wall;
   an air filter (12) for fresh air, wherein the air filter sits in the gap (4) before the ventilation opening (11);
   wherein the air filter (12) comprises a filter cartridge (13) surrounding the ventilation opening (11) and held between the inner wall (2) and the external wall (3).

2. A ventilated housing according to claim 1, wherein the filter cartridge comprises a short, cylindrical socket.

3. A ventilated housing according to claim 1, further comprising a cylindrical supporting lattice (14), into which the filter cartridge (13) is pushed.

4. A ventilated housing according to claim 3, wherein the supporting lattice (14) is located on an assembly ring (15), which is fastened to an edge of the ventilation opening (11) and is removable.

5. A ventilated housing according to claim 4, further comprising a removable cover (21) across from the ventilation opening to close the service opening (20), with a clearance larger than an outside diameter of the assembly ring (15).

6. A ventilated housing according to claim 3, wherein the supporting lattice (14) supports a removable, circular grille (22).

7. A ventilated housing for electrical and electronics components, comprising:
   an inner wall and an external wall, having a gap intermediate the inner wall and external wall;
   an intake for fresh air, which leads into the gap between the inner wall and external wall;
   an outlet for exhaust from the gap;
   a ventilation opening located in the inner wall and a service opening located in the external wall;
   a cylindrical filter cartridge for fresh air, wherein the air filter is disposed in the gap and covering the ventilation opening;
   a cylindrical supporting lattice located on a removable assembly ring, which is fastened to an edge of the ventilation opening, wherein the filter cartridge is inserted into the supporting lattice and held between the inner wall and the external wall, surrounding the ventilation opening.

8. A ventilated housing according to claim 1, wherein the supporting lattice mounts to the internal wall.

9. A ventilated housing according to claim 8, further comprising a circular grill removably mounted to the supporting lattice proximate the service opening.

10. A ventilated housing according to claim 1, wherein the intake comprises a first opening and the service opening comprises a second opening.

11. A ventilated housing according to claim 1, wherein the internal wall and the external wall comprise vertical walls.

12. A ventilated housing according to claim 11, wherein the intake comprises an opening proximate a bottom of the external and internal walls.

13. A ventilated housing for electrical and electronics components, comprising:
   a substantially vertical inner wall and a substantially vertical external wall, having a gap intermediate the inner wall and external wall;
   an intake for fresh air, which leads into the gap between the inner wall and external wall;
   an outlet for exhaust from the gap;
   a ventilation opening located in the inner wall and a service opening located in the external wall;
   a cylindrical filter cartridge for fresh air, wherein the filter cartridge is disposed with its axis extending substantially horizontal;
   a cylindrical supporting lattice, wherein the filter cartridge is inserted into the supporting lattice and is disposed between the inner wall and the external wall, covering the ventilation opening and aligned with the service opening.

14. A ventilated housing according to claim 13, wherein the supporting lattice extends around the filter cartridge.

15. A ventilated housing according to claim 13, wherein the supporting lattice mounts at a first end on a removable assembly ring, which is fastened to the internal wall at an edge of the ventilation opening.

16. A ventilated housing according to claim 13, wherein the assembly ring is threadably fastened to the internal wall.

17. A ventilated housing according to claim 13, further comprising a removable grill mounting to a second end of the supporting lattice.

18. A ventilated housing according to claim 13, wherein the service opening has a diameter larger than an outside diameter of the assembly ring.

\* \* \* \* \*